United States Patent
Nakanishi et al.

(10) Patent No.: US 8,355,204 B2
(45) Date of Patent: Jan. 15, 2013

(54) LIGHT-EXTRACTION LAYER OF LIGHT-EMITTING DEVICE AND ORGANIC ELECTROLUMINESCENCE ELEMENT EMPLOYING THE SAME

(75) Inventors: Tsutomu Nakanishi, Tokyo (JP); Akira Fujimoto, Kawasaki (JP); Shigeru Matake, Yokohama (JP); Koji Asakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 926 days.

(21) Appl. No.: 12/346,937

(22) Filed: Dec. 31, 2008

(65) Prior Publication Data
US 2009/0224660 A1 Sep. 10, 2009

(30) Foreign Application Priority Data
Mar. 10, 2008 (JP) .................................. 2008-59224

(51) Int. Cl.
*G02B 5/18* (2006.01)
*G02B 27/42* (2006.01)

(52) U.S. Cl. ........ 359/558; 359/566; 359/569; 359/572; 359/576; 359/599; 313/504; 313/506; 313/512; 349/64; 362/355

(58) Field of Classification Search .................. 313/504, 313/503, 506, 512; 359/558, 566, 569, 572, 359/576; 362/355; 349/64
See application file for complete search history.

(56) References Cited

U.S. PATENT DOCUMENTS

| | | | |
|---|---|---|---|
| 7,358,302 B2 * | 4/2008 | Matsumoto et al. ............. | 525/50 |
| 2002/0160127 A1 * | 10/2002 | Sakata et al. ................... | 428/1.6 |
| 2004/0121087 A1 * | 6/2004 | Sakata et al. ................... | 428/1.1 |
| 2005/0130063 A1 * | 6/2005 | Matsumoto et al. ........ | 430/270.1 |
| 2005/0141843 A1 * | 6/2005 | Warden et al. ................. | 385/141 |
| 2005/0142379 A1 * | 6/2005 | Juni et al. ....................... | 428/690 |
| 2006/0049745 A1 * | 3/2006 | Handa et al. ................... | 313/503 |
| 2006/0147676 A1 * | 7/2006 | Yoshida ......................... | 428/143 |
| 2006/0186802 A1 * | 8/2006 | Cok et al. ....................... | 313/506 |
| 2006/0192483 A1 | 8/2006 | Nakanishi et al. | |

(Continued)

FOREIGN PATENT DOCUMENTS
JP 11-283751 10/1999
(Continued)

OTHER PUBLICATIONS

C.F. Madigan et al., "Improvement of Output Coupling Efficiency of Organic Light-Emitting Diodes by Backside Substrate Modification," Applied Physics Letters, 76:1650-52, Mar. 27, 2000.

(Continued)

*Primary Examiner* — Nimeshkumar Patel
*Assistant Examiner* — Thomas A Hollweg
(74) *Attorney, Agent, or Firm* — Finnegan, Henderson, Farabow, Garrett & Dunner, L.L.P.

(57) ABSTRACT

The present invention provides a highly efficient light-extraction layer and an organic electroluminescence element excellent in light-extraction efficiency. The light-extraction layer of the present invention comprises a reflecting layer and a three-dimensional diffraction layer formed thereon. The diffraction layer comprises fine particles having a variation coefficient of the particle diameter of 10% or less and of a matrix having a refractive index different from that of the fine particles. The particles have a volume fraction of 50% or more based on the volume of the diffraction layer. The particles are arranged to form first areas having short-distance periodicity, and the first areas are disposed and adjacent to each other in random directions to form second areas. The organic electroluminescence element of the present invention comprises the above light-extraction layer.

14 Claims, 3 Drawing Sheets

U.S. PATENT DOCUMENTS

| | | | |
|---|---|---|---|
| 2007/0087167 A1* | 4/2007 | Yoshida | 428/143 |
| 2007/0195431 A1* | 8/2007 | Asakura et al. | 359/707 |
| 2007/0290607 A1* | 12/2007 | Okada et al. | 313/504 |
| 2008/0024053 A1 | 1/2008 | Fujimoto et al. | |
| 2008/0272689 A1* | 11/2008 | Ide et al. | 313/504 |
| 2009/0066220 A1* | 3/2009 | Handa et al. | 313/503 |

FOREIGN PATENT DOCUMENTS

| | | |
|---|---|---|
| JP | 2005-63839 | 3/2005 |
| JP | 2005-353367 | 12/2005 |
| JP | 2006-100042 | 4/2006 |
| JP | 2006-107744 | 4/2006 |
| WO | WO 2007/047585 | 4/2007 |

OTHER PUBLICATIONS

Notification of Reasons for Rejection mailed by the Japanese Patent Office on May 25, 2012, in Japanese Application No. 2008-059224 and English translation thereof.

* cited by examiner

LIGHT-EXTRACTION LAYER OF LIGHT-EMITTING DEVICE AND ORGANIC ELECTROLUMINESCENCE ELEMENT EMPLOYING THE SAME

CROSS-REFERENCE TO RELATED APPLICATIONS

This application is based upon and claims the benefit of priority from the prior Japanese Patent Applications No. 2008-59224, filed on Mar. 10, 2008; the entire contents of which are incorporated herein by reference.

BACKGROUND OF THE INVENTION

1. Field of the Invention

The present invention relates to a highly efficient reflecting plate used for a light-emitting device, and also relates to an organic electroluminescence element excellent in light-extraction efficiency employing the same.

2. Background Art

In an organic electroluminescence element (hereinafter, often referred to as "organic EL element"), the refractive index of the light-emitting part is generally approx. 2.0, which is higher than that of air 1.0. Accordingly, because of total reflection at the interface between the element and air, approx. 80% of the emitted light is confined and travels in the element, and hence cannot be extracted out (see, C. F. Madigan, M. H. Lu, J. C. Strum, Applied Physics Letters, Vol. 76, 1650(2000)). If a light-extraction layer is provided so as to extract out the light traveling in the element, the organic EL element can be improved in efficiency. The problem of the confined light is liable to occur not only in an organic EL element but also in other devices, such as liquid crystal displays and lighting devices, which comprise light-emitting parts having higher refractive indexes than air.

It is proposed to form a two-dimensional diffraction structure as the light-extraction layer in the element (see, JP-A H11-283751 (KOKAI), for example). That structure diffracts the light traveling in the element, and thereby the confined light, which hitherto has not been extracted out, can be partly extracted out of the element. As a result, the light-extraction efficiency is improved as compared with the element not provided with the diffraction structure. However, the two-dimensional diffraction structure has too small diffraction efficiency to sufficiently improve the light-extraction efficiency. Further, the diffraction structure is a submicron-order periodical structure and is generally formed in the organic EL element by the photo-lithographic process, which is used for micro-fabrication of semiconductors. Accordingly, an expensive apparatus and complicated procedures are necessary and hence it costs a lot to produce the diffraction structure. In addition, since the periodical structure causes uneven brightness on the light-emitting surface, it is necessary to take some measures when applied to displays or other devices required to have uniformity of brightness on the light-emitting surface.

It is also proposed to provide a light-scattering layer as the light-extraction layer between the substrate and the light-emitting layer in the organic EL element (see, JP-A 2006-107744 (KOKAI), for example). The light-scattering layer comprises a transparent resin and fine particles dispersed therein, and the fine particles have a refractive index different from that of the resin. In the element, light emitted from the light-emitting part is scattered by the light-scattering layer and the scattered light travels in various directions. As a result of the multiple scattering, light incident to the interface to air at an angle within the range of the total reflection angle is extracted out. Since the light-scattering layer changes the traveling direction of light at random, it is preferred that the fine particles have a broad size distribution, be arranged at random and have a large volume fraction in the scattering layer. If the size distribution is narrow or if the volume fraction is small, the light-scattering layer cannot scatter the light sufficiently. On the other hand, if the size distribution is broad, it is difficult to ideally arrange the particles in the resin. Further, if the particles having a broad size distribution are incorporated in a large volume fraction, the obtained light-scattering layer is remarkably poor in flatness and accordingly the light-emitting part in the form of a thin layer is also poor in flatness to lower reliability of the EL element considerably. Thus, this is a dilemma. In a conventional EL element with the light-scattering layer, therefore, the volume fraction is controlled at approx. 20% and hence the effect of scattering is so small that it cannot be expected to improve the light-extraction efficiency remarkably.

As described above, it is difficult to remarkably improve the light-extraction efficiency of an organic EL element by conventional technology, and accordingly it is desired to improve the efficiency.

SUMMARY OF THE INVENTION

A light-extraction layer according to one embodiment of the present invention is characterized by: comprising a reflecting layer and a three-dimensional diffraction layer which is formed on said reflecting layer and which comprises fine particles having a variation coefficient of the diameter of 10% or less and of a matrix having a refractive index different from that of said fine particles; wherein said fine particles have a volume fraction of 50% or more based on the volume of the three-dimensional diffraction layer, said fine particles are arranged to form first areas having short-distance periodicity, and said first areas are disposed and adjacent to each other in random directions to form second areas.

Further, an organic electroluminescence element according to another embodiment of the present invention is characterized by: comprising a substrate, a light-extraction layer provided on said substrate, and a light-emitting layer which is provided on said light-extraction layer and which has at least one organic layer placed between first and second electrodes; wherein said light-extraction layer comprises a reflecting layer placed on the side of said substrate and a three-dimensional diffraction layer which is placed on the side of said light-emitting layer and which comprises fine particles having a variation coefficient of the particle diameter of 10% or less and of a matrix having a refractive index different from that of said fine particles, said fine particles have a volume fraction of 50% or more based on the volume of said three-dimensional diffraction layer, said fine particles are arranged to form first areas having short-distance periodicity, and said first areas are disposed and adjacent to each other in random directions to form second areas.

Furthermore, an organic electroluminescence element according to still another embodiment of the present invention is characterized by: comprising a substrate, a light-extraction layer provided on said substrate, and a light-emitting layer which is provided on said light-extraction layer and which has at least one organic layer placed between first and second electrodes; wherein said light-extraction layer comprises a reflecting layer which is placed on the side of the substrate and which has a reflectivity of 80% or more at the wavelength of 550 nm, and a three-dimensional diffraction layer which is placed on the side of said light-emitting layer and which comprises fine particles having a mean particle size of 200 to 800 nm and a variation coefficient of the diameter of 10% or less and of a matrix having a refractive index different from that of said fine particles; said fine particles have a volume fraction of 50% or more based on the volume of the three-dimensional diffraction layer: said fine particles are arranged and accumulated in the thickness direction in 2 to 30 layers to form first areas having short-distance periodicity; and said first areas are disposed and adjacent to each other in random directions to form second areas in said three-dimensional diffraction layer.

According to embodiments of the present invention, highly efficient light extraction layer for light-emitting devices and organic electroluminescence elements excellent in light-extraction efficiency are provided.

DETAILED DESCRIPTION OF THE INVENTION

Embodiments of the present invention are explained below with the attached drawings referred to.

Figure 1:
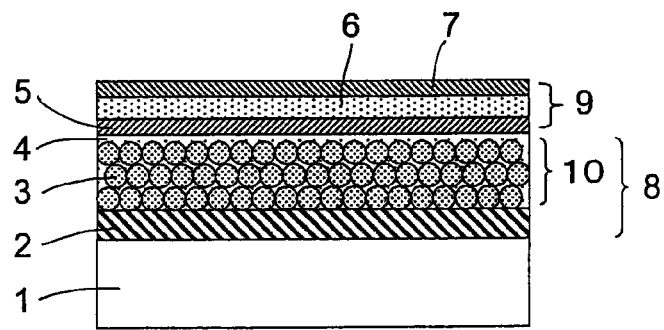
FIG. 1 is a schematic sectional view of an organic EL element according to one embodiment of the present invention.

FIG. 1 is a schematic sectional view showing an example of the structure of a top emitting type organic EL element according to one embodiment of the present invention. Needless to say, the structure shown in FIG. 1 is nothing but a representative example for explaining one embodiment of the present invention, and hence it by no means restricts the present invention.

As shown in FIG. 1, the organic EL element according to the present invention comprises a substrate 1, a light-extraction structure 8 and a light-emitting part 9. The substrate 1, the light-extraction layer 8 and the light-emitting layer 9 are stacked in order on the substrate 1 in the element shown in FIG. 1, but other parts such a driving circuit part and a protective layer can be placed between the substrate 1 and the light-extraction layer 8. Further, a flatting layer or the like can be provided between the light-extraction layer 8 and the light-emitting layer 9.

The organic EL element shown in FIG. 1 has a top emitting type structure, and hence emits light from the surface on the side opposite to the substrate 1. In contrast with a bottom-emission type element, which emits light from the surface on the side of the substrate 1, the substrate 1 of the top emitting type element does not need to be transparent. Accordingly, there is no particular restriction on the substrate 1 as long as it serves as a support of the element. The substrate 1 can be selected, according to purposes, from the group consisting of a glass substrate, a Si substrate, a plastic substrate and the like.

The light-emitting layer 9 can be the same as that used in a normal organic EL element. The light-emitting layer of the embodiment shown in FIG. 1 is an example thereof, and comprises a first electrode 5, a second electrode 7 and an organic layer 6 placed between them. One of the electrodes 5 and 7 is an anode and the other is a cathode. The anode has a function of injecting holes into the organic layer 6, and hence is preferably made of a material having a work function of 4.0 eV or more. Examples of the anode materials include indium oxide-tin alloy (ITO), tin oxide, zinc oxide, metals such as gold, silver, platinum and copper, oxides thereof, and mixtures thereof. On the other hand, the cathode has a function of injecting electrons, and hence is preferably made of a material having a small work function. Examples of the cathode materials include metals such as indium, aluminum, magnesium, lithium, scandium, gold, silver, platinum, copper, and mixtures thereof.

Both of the first and second electrodes 5 and 7 are preferably transparent to light emitted from the light-emitting layer 9. The first electrode 5 is preferably so transparent that light emitted from the light-emitting layer 9 can pass through the first electrode 5 without loss into the light-extraction layer 8. On the other hand, the second electrode 7, which is placed on the light-emitting side, is also preferably so transparent that light emitted from the light-emitting layer 9 and light reflected by the light-extraction layer 8 can be given off without loss from the light-emitting surface. Therefore, the electrode working as the anode is preferably a transparent electrode made of, for example, ITO, tin oxide or zinc oxide. The cathode is preferably a metal semi-transparent electrode in the form of a very thin film. In that case, for ensuring electric conductivity, a metal semi-transparent electrode and a transparent electrode of ITO or the like can be combined to form a cathode having a multi-layered structure. For example, after a magnesium-silver alloy having 15 nm thickness is formed, an ITO of 200 nm thickness is provided thereon to prepare a transparent cathode. Either of the first and second electrodes can be adopted as the cathode or the anode. However, in view of the process for producing a top emitting type organic EL element, the first and second electrodes preferably serve as the anode and the cathode, respectively.

A top emitting type organic EL element is generally constructed in order from the substrate side. After the first electrode 5 is provided, the organic layer 6 is formed and then the second electrode 7 is provided thereon. The organic layer 6 is generally made of organic molecule or polymer, and is liable to deteriorate when suffering physical damage such as ion bombardment or heat in the process. Since the transparent electrode such as an ITO electrode is normally formed by sputtering, the organic layer 6 is often damaged by heat and ion bombardment when the transparent electrode is formed thereon. It is, therefore, preferred to form the transparent electrode before the organic layer 6 is formed. After the organic layer 6 is provided, it is necessary to form the metal semi-transparent electrode. However, since the metal semi-transparent electrode is normally formed by the vacuum deposition process, the organic layer 6 is scarcely damaged. The thus-provided metal semi-transparent electrode serves as a barrier to protect the organic layer 6 from the damage even if the transparent electrode such as an ITO electrode is formed thereafter by sputtering.

The organic layer 6 placed between the first and second electrodes 5 and 7 can have a layered structure comprising an active layer, where the holes and the electrons are recombinated. In addition to the active layer, the layered structure may comprise a hole transfer layer and/or an electron transfer layer so as to improve recombination efficiency of the holes and the electrons. The hole transfer layer is, if provided, placed between the active layer and the anode, and the electron transfer layer is placed between the active layer and the cathode. There is no particular restriction on the materials of the active layer, the hole transfer layer and the electron transfer layer. The materials may be compounds of molecules or polymer, and any materials normally used for the active layer, the hole transfer layer and the electron transfer layer in known organic EL elements can be used.

Examples of the materials for the active layer include: tris(8-quinolinol)aluminum complex ($Alq_3$), bisdiphenyl-vinylbiphenyl (BDPVBi), 1,3-bis(p-t-butylphenyl-1,3,4-oxadiazolyl)phenyl (OXD-7), N,N'-bis(2,5-di-t-butylphenyl) perylene tetracarboxylic diimide (BPPC), and 1,4-bis(p-tolyl-p-methyl-styrylphenylamino)naphthalene. Examples of the materials for the hole transfer layer include: bis(di(p-tolyl)amino-phenyl)-1,1-cyclohexane; triphenyidiamines such as triphenyl-diamine (TPD) and N,N'-diphenyl-N,N'-bis (1-naphthyl)-1,1'-bi-phenyl)-4,4'-diamine (α-NPD); and star-burst type molecules. Examples of the materials for the electron transfer layer include: oxadiazole derivatives such as 2-(4-bi-phenylyl)-5-(4-t-butylphenyl)-1,3,4-oxadiazole (Bu-PBD) and OXD-7; triazole derivatives; and metal complexes of quinolinol type. The thickness of the organic layer 6 is not particularly restricted, but is normally and preferably in the range of 0.01 μm to 1 μm.

The light-extraction layer 8 is formed between the substrate 1 and the light-emitting layer 9. The light-extraction layer 8 comprises a reflecting layer 2 and a three-dimensional diffraction layer 10 comprising fine particles 3 and a matrix 4. The reflecting layer 2 is formed between the substrate 1 and the light-emitting layer 9, and the three-dimensional diffraction layer 10 is placed between the reflecting layer 2 and the light-emitting layer 9. As described later in detail, the light-extraction layer 8 is the most characteristic part for giving the effect of the present invention. The light-extraction layer 8 enables to produce an organic EL element having higher efficiency than ever.

The reflecting layer 2 has a function of reflecting light having passed through the three-dimensional diffraction layer 10 toward the light-emitting surface. In order to reflect the light toward the light-emitting surface in high efficiency, the reflecting layer 2 is made of a material having a reflectivity of preferably 80% or more, further preferably 90% or more, at the wavelength of the light emitted from the light-emitting layer, for example, at 550 nm. Examples of the materials for the reflecting layer 2 include metals such as silver, aluminum and alloys thereof. There is no particular restriction on the method for forming the reflecting layer, and hence known methods such as the sputtering process and the vacuum deposition process can be adopted. The thickness of the reflecting layer 2 is preferably 30 nm or more, further preferably 50 nm or more, so as to prevent light from passing through the reflecting layer and thereby to reduce loss of the light. Further, in order to improve adhesion to the substrate 1, the substrate 1 can be subjected to surface treatment and/or a buffer layer or the like can be provided before the reflecting layer 2 is formed. During the process performed after the reflecting layer 2 is formed, the reflectivity of the reflecting layer 2 is often deteriorated by moisture, oxygen or heat. Accordingly, to avoid the deterioration, a protective layer can be formed on the reflecting layer 2. For example, although silver shows high reflectivity and has low absorption in the visible wavelength region, the layer formed by depositing silver only on the substrate is liable to considerably lose the reflectivity because the silver gradually aggregates with the time elapsed. Therefore, an alloy of silver with palladium or magnesium is used, or a very thin ITO having a thickness of approx. 10 nm is employed as the buffer layer or the protective layer, so that the reflectivity can be kept high and the reflecting layer 2 having high reliability can be obtained.

Figure 2:
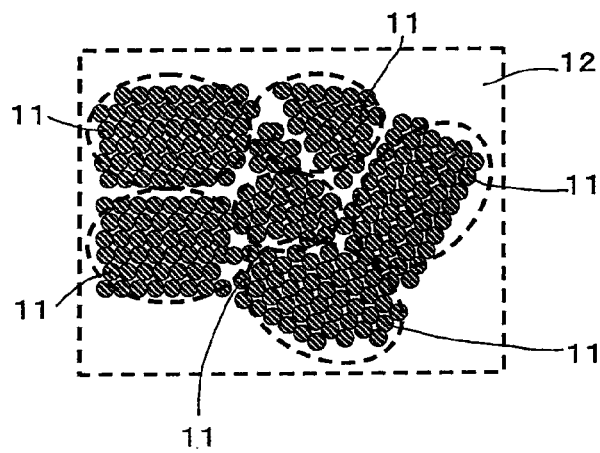
FIG. 2 schematically illustrates a three-dimensional diffraction structure of an organic EL element according to the present invention.

The three-dimensional diffraction layer 10 in the form of a thin film is provided on the reflecting layer 2. This layer has a three-dimensional structure which comprises fine particles 3 and a matrix 4 having a refractive index different from that of the particles 3. In the matrix 4, the fine particles 3 are so arranged that plural first areas 11 (domains) having not long- but short-distance periodicity are formed and disposed in random directions to form second areas 12. If the arrangement of the fine particles in the three-dimensional diffraction layer 10 is observed from the side of the light-emitting surface, it can be seen, for example, as shown in FIG. 2. The structure of the three-dimensional diffraction layer is, as it were, not a single crystal but a polycrystal if the fine particles 3 and the layer are compared to atoms and a crystal, respectively. The fine particles are arranged to form domain structures having three-dimensional short-distance periodicity (which correspond to, for example, body-centered cubic lattice structures (hereinafter, referred to as "BCC structures"), face-centered cubic lattice structures (hereinafter, referred to as "FCC structures") or hexagonal closed packing structures (hereinafter, referred to as "HCP structures")), and the domain structures are disposed to form the three-dimensional diffraction layer 10 as a whole.

There is no particular restriction on the fine particles in the first areas 11, as long as they are arranged three-dimensional periodically. They can be arranged to form a BCC structure, a FCC structure, a HCP structure or the like. The intervals among the particles in the first areas 11 are preferably in the range of 80% to 120% based on the average interval in the areas 11. In each first area 11, at least 5 number of the fine particles are preferably arranged periodically in the direction of each primitive translation vector. For enhancing the light-extraction efficiency further, it is more preferred to arrange 10 or more number of the fine particles periodically in the direction of each primitive translation vector. The number of the particles arranged continuously in the direction of the primitive translation vector is preferably not more than 5000, more preferably not more than 1000, so as to prevent uneven brightness on the light-emitting surface. The number of the particles in each first area 11 does not need to be identical, and there is no particular restriction on the distribution thereof.

Materials of the fine particles 3 are not particularly limited, but the particles are preferably made of materials having small absorption at the wavelength of light emitted from the light-emitting layer. Examples of the materials include silica, alumina, titania, zinc oxide, samarium oxide, zirconia, and mixtures thereof. Further, bubbles or voids as the fine particles can be arranged in the matrix. In other words, the fine particles may be made of air.

The fine particles 3 preferably have a mean particle size of 200 to 800 nm. If the particles in the three-dimensional diffraction layer have a mean particle size of less than 200 nm, the light in the visible region is often not enough diffracted to obtain the effect of the present invention satisfyingly. On the other hand, if the mean particle size of the particles is more than 800 nm, the light-extraction efficiency is improved but the three-dimensional diffraction layer is so thickened that the process for forming a contact hole connecting to the driving circuit becomes more complicated and that the whole element is thickened. Accordingly, it is not preferred. In the present invention, the "mean particle size" is defined by an average of 100 number of particle diameters measured by scanning electron microscopy.

It is necessary for the fine particles 3 to have particle size distribution represented by a variation coefficient of the diameter (hereinafter, referred to as "CV value") of 10% or less. The CV value is generally used to represent size distribution of fine particles, and is calculated according to the formula:

(standard deviation of the particles/mean particle size)×100.

If the CV value is more than 10%, the sizes of the particles are so dispersed that the particles are difficult to be arranged periodically in the first areas 11 and, as a result, that the effect of the present invention is poorly obtained. Accordingly, in order to obtain the effect of the present invention satisfyingly, the CV value is preferably 5% or less.

It is also necessary for the fine particles 3 to have a volume fraction of 50% or more in the three-dimensional diffraction layer 10. If the volume fraction is less than 50%, the particles in the first areas are often positioned at random or the gaps among the first areas are liable to expand. The volume fraction of the particles in the three-dimensional diffraction layer 10 is 100% or less. When the volume fraction is 100%, the three-dimensional diffraction layer 10 contains no solid material matrix. In that case, air serves as the matrix.

In the three-dimensional diffraction layer 10 or in the first areas 11, the fine particles 3 are accumulated in the thickness direction to form layers. The number of the layers is preferably in the range of 2 to 30. According to the inventors' study, if the fine particles 3 form a single layer, the effect of the multiple-diffraction is extremely small to lower the effect of the present invention. On the other hand, if the fine particles 3 form more than 30 layers, the light-extraction efficiency is improved but the three-dimensional diffraction layer is so thickened that the process for forming a contact hole connecting to the driving circuit becomes more complicated and that the whole element is thickened. Accordingly, it is not preferred.

The matrix 4 is made of a material having a refractive index different from that of the fine particles 3 and having small absorption at the wavelength of light emitted from the light-emitting layer. The material of the matrix 4 may be an organic material, an inorganic material or an organic-inorganic composite material. Examples of the organic material include polymer materials such as acrylic resin, polystyrene resin, silicone resin, phenol resin, novolac resin, and mixtures thereof. Examples of the inorganic material include metal oxides such as silica (including SOG and porous silica), alumina, titania, zinc oxide, and zirconia. Examples of the organic-inorganic composite material include resins containing nano-particles of metal oxide, such as titania, ceria, magnesium oxide, zinc oxide and zirconia, dispersed therein. Further, air can be used as the matrix. In that case, although the three-dimensional diffraction layer 10 seems to consist of only the fine particles, air is present among the particles and hence can be regarded as the matrix. The difference between the refractive index of the fine particles and that of the matrix is not particularly restricted but is preferably not less than 0.02, more preferably not less than 0.10. The larger the difference of the refractive index is, the more the light is diffracted and hence the more the light-extraction efficiency is improved.

The effect of the light-extraction layer 8 is then described below. The light-extraction layer 8 comprises the reflecting layer 2 and the three-dimensional diffraction layer 10 in the form of a thin membrane provided thereon. The three-dimensional diffraction layer 10 has a structure in which the fine particles 3 are so arranged that plural first areas 11 (domains) having not long- but short-distance periodicity are formed and disposed in random directions to form second areas 12 (FIG. 2). Since the refractive index of the fine particles 3 is different from that of the matrix 4, the layer has a diffraction structure. Light emitted from the light-emitting layer 9 is incident to the three-dimensional diffraction layer 10, and the incident light is partly diffracted by the layer of the particles positioned at the surface. The rest of light not diffracted and having passed through the surface layer is again partly diffracted by the second layer. In this way, the light repeatedly undergoes diffraction by each layer. Consequently, because of the multiple-diffraction, the efficiency of diffraction is improved. Further, the light once diffracted by each layer repeatedly undergoes the multiple-diffraction in the three-dimensional diffraction layer. The thus diffracted light travels in various directions in the diffraction layer. However, if the arrangement of the particles in the diffraction layer 10 has periodicity as a whole, light undergoing the multiple diffraction and emitted from the diffraction layer 10 exhibits a diffraction peak characterized by the arrangement of the particles. This means that the reflected light emitted from the diffraction layer 10 is observed at a particular position and at a particular angle. Accordingly, the light incident to the interface between the element and air at an angle out of the range of the total reflection angle cannot be extracted out. Further, since the light is reflected in a particular direction, brightness on the light-emitting surface is unevenly distributed and hence viewability of the resultant light-emitting element is impaired.

On the other hand, in the three-dimensional diffraction layer 10 according to the present invention, the fine particles 3 in the matrix 4 are so arranged that plural first areas 11 having not long- but short-distance periodicity are formed and disposed in random directions to form second areas 12. Light traveling in the diffraction layer 10 is repeatedly diffracted in the first areas, and the traveling direction thereof is randomly changed at the borders of the first areas. As a result, light emitted from the diffraction layer does not exhibit a peak at a particular position and at a particular angle. The reflected light is emitted in a random direction because of specular reflection, diffraction and multiple-diffraction. In other words, according to the present invention, light is seen hemispherically on the substrate surface. Consequently, in the present invention, light incident to the light-extraction layer 8 improved in a diffraction efficiency is diffracted, so that not only the amount of light diffracted in a particular direction is increased but also the light is diffracted and travels in various directions. As a result, possibility that the diffracted light comes within the range of the total reflection angle is increased to improve remarkably the light-extraction efficiency.

If the long-distance periodicity is lost, it is normally expected to lose the effect of diffraction because the efficiency of diffraction is lowered. However, the effect of diffraction can be sufficiently obtained only if the first areas 11 have three-dimensional periodicity and at least 5 number of the fine particles are continuously arranged in the direction of the primitive translation vector. The theory of this is explained below.

In the case where particular fine particles are present on a surface to which light is incident, the light is scattered at a particular scattering angle. If the fine particles are periodically arranged, the scattered light is seen at a particular angle to be diffracted light. That is because the scattered light given by the mass of the fine particles is a total of light scattered by each particle. The intensity of diffracted light I(K) is generally represented by the following formula (2):

$$I(K)=F(K)\cdot F(-K)\cdot Ga^2(K)\cdot Gb^2(K)\cdot Gc^2(K) \quad (2)$$

in which K is a diffraction vector; F(k) is a crystal structure factor; and Ga(K), Gb(K) and Gc(K) are Laue functions of a three-dimensional periodic structure having periodic directions a, b and c, and are represented by the following formulas (3), (4) and (5), respectively:

$$Ga^2(K)=\sin^2[\pi(2Na+1)(K\cdot a)]/\sin^2[\pi(K\cdot a)] \quad (3)$$

$$Gb^2(K)=\sin^2[\pi(2Nb+1)(K\cdot b)]/\sin^2[\pi(K\cdot b)] \quad (4)$$

$$Gc^2(K)=\sin^2[\pi(2Nc+1)(K\cdot c)]/\sin^2[\pi(K\cdot c)] \quad (5)$$

in which a, b and c are primitive translation vectors in the periodic directions of a, b and c, respectively; and Na, Nb and Nc are numbers of concaves and convexes in the directions of a, b and c, respectively. The Laue function of the formula (3) gives the maximum when K·a is an integer, and the width of the maximum peak becomes narrower in inverse proportion to 2Na+1. This is also applied to the similar functions of the formulas (4) and (5). Accordingly, the more the fine particles are incorporated, the sharper the diffraction intensity becomes. However, if 5 or more number of the particles are arranged in the direction of the primitive translation vector, the width of the peak is almost the same. Therefore, the number of the particles arranged along the primitive translation vector is preferably 5 or more, further preferably 10 or more.

On the other hand, however, if more than 5000 number of the particles are continuously arranged in the direction of the primitive translation vector, the peaks attributed to the multiple-diffraction are seen on the light-emitting surface. Therefore, the number of the particles arranged along the primitive translation vector is preferably 5000 or less, further preferably 1000 or less.

Figure 3:
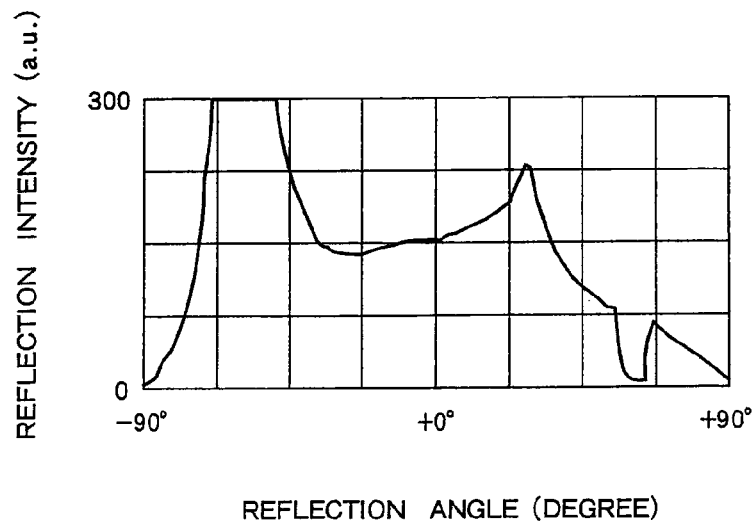
FIG. 3 is a graph showing reflection characteristics of a three-dimensional diffraction structure according to the present invention.

By way of an example for explaining the three-dimensional diffraction structure of the present invention, light at the wavelength of 550 nm was applied at the angle of −60° to a three-dimensional diffraction structure containing fine particles having the mean particle size of 400 nm, and then the reflection intensity in the incident plane was measured. The obtained reflection characteristic was shown in FIG. 3. In the graph, a peak corresponding to the specular reflection was seen at 60° and another peak corresponding to diffracted light was also seen at 20°. Further, the graph indicated that light was emitted at all the angles, namely, hemispherically. Accordingly, it was clear that the emitted light comprised reflected light, diffracted light and multiple-diffracted light. The light-extraction layer of the present invention, which reflects light hemispherically, can be also employed as a reflecting plate for various light-emitting devices.

In the present invention, the light-extraction layer is produced by forming a reflecting layer and then forming a three-dimensional diffraction layer thereon. There is no particular restriction on the method for forming them. The reflecting layer, in particular, is formed by known methods such as the sputtering process and the CVD process. The method for forming the three-dimensional diffraction layer is not restricted, either. However, in view of both easiness of the layer formation and applicability to the process for producing an organic EL element, the following procedures are preferred.

For forming a three-dimensional diffraction layer which comprises fine particles such as silica and a matrix such as acrylic polymer, first a matrix material such as acrylic monomer is dissolved in an organic solvent, if necessary. The fine particles are dispersed therein to prepare a composition, which is then coated on the reflecting layer. Thereafter, the matrix material is hardened to form the three-dimensional diffraction layer. In the layer formed by coating the composition, the fine particles are accumulated in a relatively high density to be arranged like atoms constituting a crystal structure. Preferably, the content of the fine particles in the matrix is relatively high enough to align the particles in a desired arrangement. It is preferably 50% or more, further preferably 60% or more.

The composition can be coated by any known method such as spin-coating, dip-coating or slit-coating. The composition after coated is then subjected to heating treatment or the like for hardening the matrix, if necessary, to form the three-dimensional diffraction layer.

Further, after the matrix is hardened in the above manner, the fine particles can be removed by dissolving or the like to form bubbles in the diffraction layer. For example, after a composition containing silica particles is coated and hardened, an agent capable of dissolving the silica particles but not the matrix is applied to remove only the silica particles.

Furthermore, after a composition containing fine particles is coated, it is also possible to remove only the medium of the composition and thereby to form a three-dimensional diffraction layer comprising the fine particles and air as the matrix.

Figure 4:
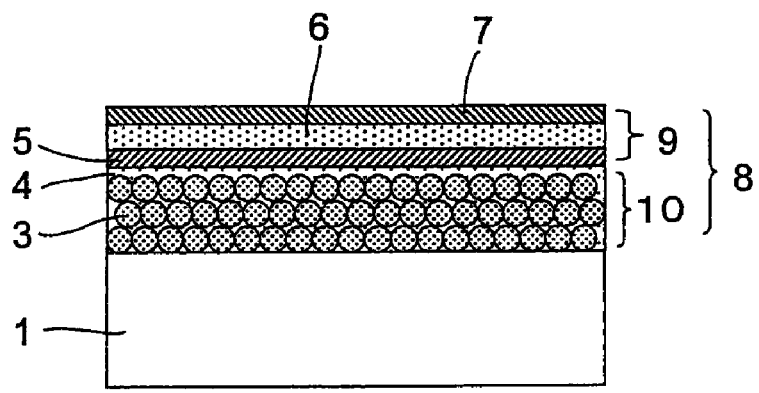
FIG. 4 is a schematic sectional view of an organic EL element according to another embodiment of the present invention.
Figure 5:
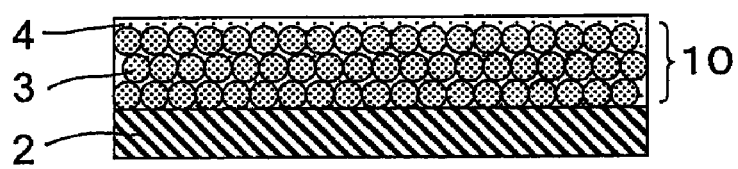
FIG. 5 is a schematic sectional view of a reflecting plate for a light-emitting device according to still another embodiment of the present invention.

The organic EL element according to the present invention can have a bottom-emission type structure as well as a top emitting type structure. FIG. 4 is a schematic sectional view of an example thereof. In the bottom-emission type structure, the electrode can be made to serve as the reflecting layer. The present invention can be applied to not only an organic EL element but also a reflecting plate (FIG. 5) of light-emitting devices, such as liquid crystal displays and lighting devices, which emit light from parts having higher refractive indexes than air.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

EXAMPLES

The present invention is further explained by the following concrete examples. Needless to say, those examples by no means restrict the present invention.

Example 1

Figure 6:
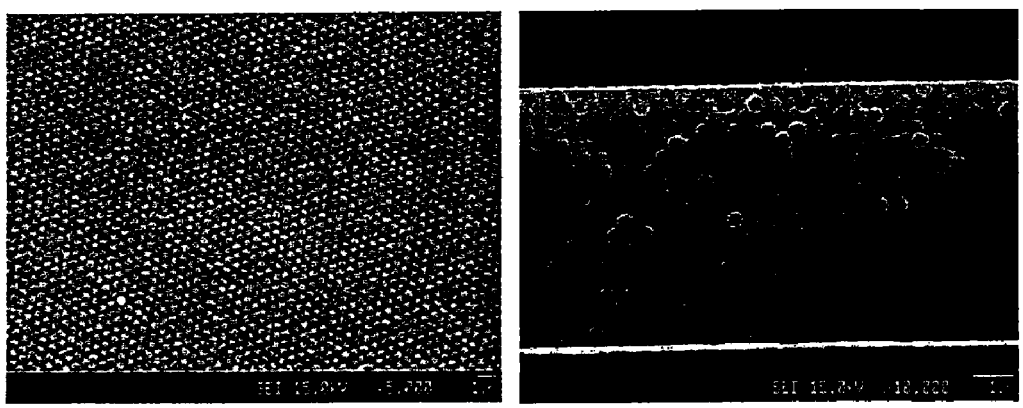
FIG. 6 is an electron micrograph of the three-dimensional diffraction structure produced in Example 1.

A glass substrate (refractive index: 1.48; TEMPAX Float [trademark], manufactured by Schott Nippon K.K.) as the substrate was prepared. After ITO was sputtered on the glass substrate to form a buffer layer of 10 nm thickness, silver was sputtered thereon to produce a reflecting layer of 200 nm thickness, and then ITO was sputtered again thereon to form a protective layer of 10 nm thickness. Independently, silica particles (mean particle size: 380 nm; CV value: 5%; n=1.42; PL-13 [trademark], manufactured by Fuso Chemical Co., Ltd.), which were beforehand surface-modified with a silane-coupling agent to have surfaces modified with acryl groups, were dispersed in three-functional acrylic monomer (ETPTA: ethoxylated trimethylolpropane triacrylate; n=1.47; manufactured by Aldrich Corp.) in the volume fraction of 60%. The prepared dispersion was spin-coated on the substrate at 2000 rpm, and then subjected to bake treatment on a hot-plate at 150° C. for 1 hour so as to thermally cure the acrylic monomer as the matrix. Thus, a three-dimensional diffraction layer comprised the silica particles and the acrylic polymer matrix was formed. A section of the obtained sample was observed by FE-SEM (field-emission scanning electron microscopy) to confirm that the particles were arranged like a crystal structure to form 20 layers (FIG. 6). This three-dimensional diffraction layer and the reflecting layer constituted a light-extraction layer according to the present invention. Further, SiO was vapor-deposited thereon to form a flatting layer of 200 nm thickness, and then ITO was sputtered to provide an anode of 100 nm thickness. Thereafter, α-NPD was vapor-deposited and accumulated in vacuum to form a hole transfer layer of 50 nm thickness, and then $Alq_3$ was vapor-deposited and accumulated in vacuum to form an active layer of 80 nm thickness. Finally, after magnesium-silver alloy was vapor-co-deposited in vacuum at the deposition-rate ratio of 10:1 to produce a cathode of 15 nm thickness, ITO was sputtered to form a light-emitting layer of 200 nm thickness. The sample was sealed with another glass substrate in nitrogen atomosphere, to obtain a top emitting type organic EL element.

Example 2

Figure 7:
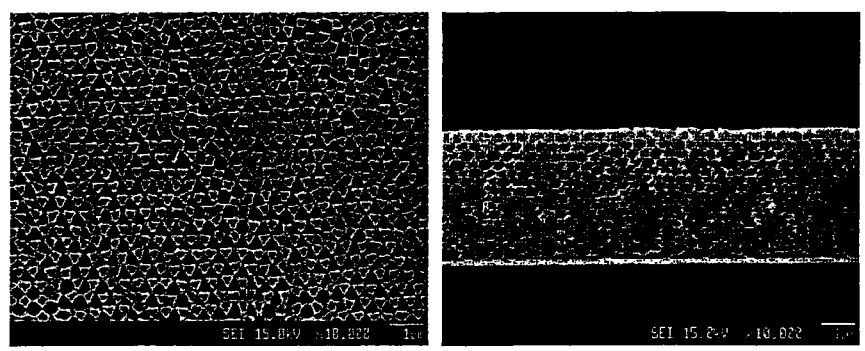
FIG. 7 is an electron micrograph of the three-dimensional diffraction structure produced in Example 2.

The procedures of Example 1 were repeated to form a three-dimensional diffraction layer on the substrate. Thereafter, the sample was immersed in 5% hydrofluoric acid aqueous solution for 5 minutes, and washed with flowing water for 15 minutes to remove only the silica particles accumulated in the layers. A section of the obtained sample was observed by SEM to confirm that only the particles were clearly removed and thereby that a three-dimensional diffraction layer comprises air bubbles as the fine particles and acrylic polymer as the matrix was produced (FIG. 7). In the same manner as in Example 1, a light-emitting layer was then formed on the three-dimensional diffraction layer. The sample was sealed with another glass substrate in nitrogen atomosphere, to obtain a top emitting type organic EL element.

Example 3

Figure 8:
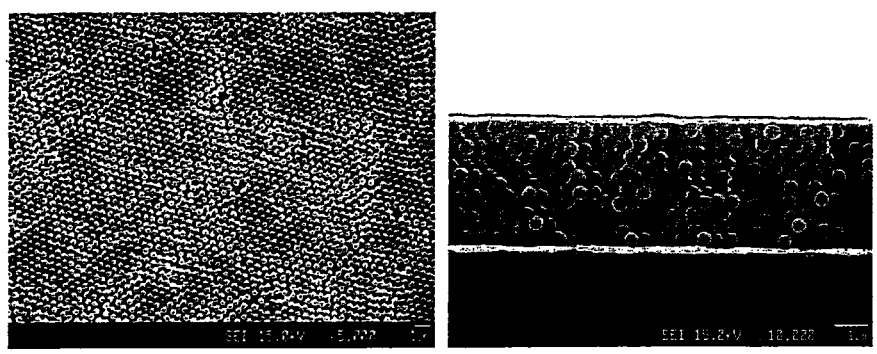
FIG. 8 is an electron micrograph of the three-dimensional diffraction structure produced in Example 3.

The procedures of Example 1 were repeated except that the three-functional acrylic monomer was changed into trimethylol propane triacrylate (n=1.47; manufactured by Aldrich Corp.), to prepare a silica-dispersion, which was then spin-coated on the substrate at 2000 rpm. The sample was then subjected to bake treatment on a hot-plate at 150° C. for 1 hour, to evaporate the acrylic monomer. Thus, a three-dimensional diffraction layer comprised the silica particles and air as the matrix was produced. A section of the obtained sample was observed by FE-SEM to confirm that the particles were arranged like a crystal structure to form 15 layers (FIG. 8). This three-dimensional diffraction layer and the reflecting layer constituted a light-extraction layer according to the present invention. In the same manner as in Example 1, a light-emitting layer was then formed on the three-dimensional diffraction layer. The sample was sealed with another glass substrate in nitrogen atomosphere, to obtain a top emitting type organic EL element.

Comparative Example 1

The procedures of Example 1 were repeated except that the three-dimensional diffraction layer was not formed, to produce an organic EL element of Comparative Example 1.

Figure 9:
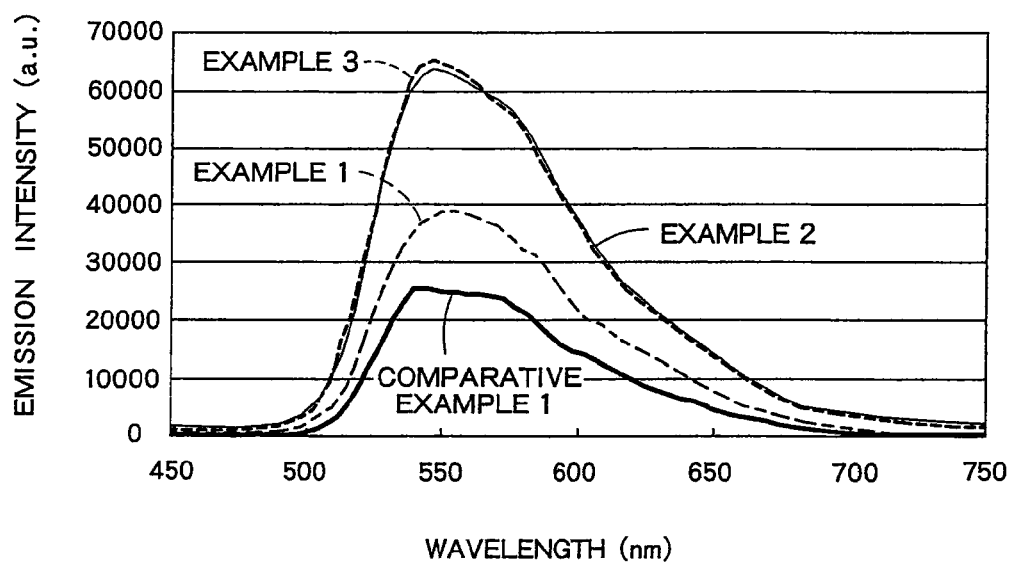
FIG. 9 shows emission spectra of the organic EL elements produced in Examples 1 to 3.

A DC voltage of 8 V was applied to each of the organic EL elements produced in Examples 1 to 3 and Comparative Example 1, and brightness and distribution thereof on the light-emitting surface were measured and compared. As a result, the organic EL elements of Examples 1 to 3 exhibited 1.60 times, 2.49 times and 2.65 times, respectively, as strong emission as that of Comparative Example 1 did (FIG. 9).

The present invention can be advantageously applied to optical elements such as organic EL displays and reflection plates of light-emitting devices.

The invention claimed is:

1. A light-extraction layer comprising
a reflecting layer and
a three-dimensional diffraction layer which is formed on said reflecting layer and which comprises fine particles having a mean particle size of 200 to 800 nm and a variation coefficient of the particle diameter of 10% or less and of a matrix having a refractive index different from that of said fine particles, wherein
said fine particles have a volume fraction of 50% or more based on the volume of the three-dimensional diffraction layer, said fine particles are arranged to form first areas having short-distance periodicity, and said first areas are disposed and adjacent to each other in random directions.

2. The light-extraction layer according to claim 1, wherein said fine particles are accumulated in the thickness direction to form 2 to 30 layers in said first areas.

3. The layer according to claim 1, wherein said fine particles are selected from the group consisting of silica, alumina, titania, zinc oxide, samarium oxide, zirconia, and mixtures thereof.

4. The layer according to claim 1, wherein said fine particles are bubbles arranged in the matrix.

5. The layer according to claim 1, wherein said matrix is an organic polymer material.

6. The layer according to claim 1, wherein said matrix is an inorganic material having a refractive index different from the refractive index of said fine particles.

7. The layer according to claim 1, wherein said matrix is air.

8. The layer according to claim 1, wherein the difference between the refractive index of said fine particles and that of said matrix is 0.02 or more.

9. The layer according to claim 1, wherein 2 to 5000 number of said fine particles are continuously arranged in the directions of the primitive translation vectors in said first areas.

10. The layer according to claim 1, wherein said reflecting layer has a reflectivity of 80% or more at the wavelength of 550 nm.

11. The layer according to claim 1, wherein said reflecting layer is made of a material selected from metals and alloy thereof.

12. An organic electroluminescence element comprising a substrate, a light-extraction layer provided on said substrate, and a light-emitting layer which is provided on said light-extraction layer and which has at least one organic layer placed between first and second electrodes; wherein
said light-extraction layer comprises a reflecting layer placed on the side of said substrate and a three-dimensional diffraction layer which is placed on the side of said light-emitting layer and which comprises fine particles having a mean particle size of 200 to 800 nm and a variation coefficient of the particle diameter of 10% or less and of a matrix having a refractive index different from that of said fine particles, said fine particles have a volume fraction of 50% or more based on the volume of the three-dimensional diffraction layer, said fine particles are arranged to form first areas having short-distance periodicity, and said first areas are disposed and adjacent to each other in random directions.

13. The element according to claim 12, wherein a flatting layer is further provided between said light-extraction layer and said light-emitting layer.

14. An organic electroluminescence element comprising a substrate, a light-extraction layer provided on said substrate, and a light-emitting layer which is provided on said light-extraction layer and which has at least one organic layer placed between first and second electrodes; wherein said light-extraction layer comprises a reflecting layer which is placed on the side of the substrate and which has a reflectivity of 80% or more at the wavelength of 550 nm, and a three-dimensional diffraction layer which is placed on the side of said light-emitting layer and which comprises fine particles having a mean particle size of 200 to 800 nm and a variation coefficient of the particle diameter of 10% or less and of a matrix having a refractive index different from that of said fine particles; said fine particles have a volume fraction of 50% or more based on the volume of the three-dimensional diffraction layer; said fine particles are arranged and accumulated in the thickness direction in 2 to 30 layers to form first areas having short-distance periodicity; and said first areas are disposed and adjacent to each other in random directions in said three-dimensional diffraction layer.

* * * * *